(12) United States Patent
Yang et al.

(10) Patent No.: US 11,362,144 B2
(45) Date of Patent: Jun. 14, 2022

(54) DISPLAY PANEL WITH VARIABLE MICRO-CAVITY LENGTHS FOR SUB-PIXELS, METHOD FOR FABRICATING THE SAME AND DISPLAY DEVICE

(71) Applicant: BOE Technology Group Co., Ltd., Beijing (CN)

(72) Inventors: Shengji Yang, Beijing (CN); Xue Dong, Beijing (CN); Xiaochuan Chen, Beijing (CN); Hui Wang, Beijing (CN); Pengcheng Lu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 91 days.

(21) Appl. No.: 16/611,245

(22) PCT Filed: Feb. 26, 2019

(86) PCT No.: PCT/CN2019/076199
§ 371 (c)(1),
(2) Date: Nov. 6, 2019

(87) PCT Pub. No.: WO2019/214322
PCT Pub. Date: Nov. 14, 2019

(65) Prior Publication Data
US 2021/0028243 A1 Jan. 28, 2021

(30) Foreign Application Priority Data
May 7, 2018 (CN) .......................... 201810427174.4

(51) Int. Cl.
*H01L 27/32* (2006.01)
*H01L 51/50* (2006.01)
(Continued)

(52) U.S. Cl.
CPC ...... *H01L 27/3206* (2013.01); *H01L 51/5044* (2013.01); *H01L 51/5265* (2013.01);
(Continued)

(58) Field of Classification Search
CPC .................................................. H01L 27/3206
(Continued)

(56) References Cited

U.S. PATENT DOCUMENTS

2007/0102737 A1  5/2007  Kahiwabara et al.
2008/0224605 A1*  9/2008  Noh ..................... H01L 51/5265
                                                                  313/504
(Continued)

FOREIGN PATENT DOCUMENTS

CN         1868240 A1    11/2006
CN       103928495 A1     7/2014
(Continued)

OTHER PUBLICATIONS

Office Action for corresponding Chinese Application No. 201810427174.4 dated Aug. 11, 2021.
(Continued)

*Primary Examiner* — Ajay Arora
(74) *Attorney, Agent, or Firm* — ArentFox Schiff LLP; Michael Fainberg

(57) ABSTRACT

A display panel, a method for fabricating the same, and a display device are provided. The display panel includes: a base substrate, and a plurality of pixels in an array on the base substrate, wherein each pixel includes a plurality of sub-pixels; each sub-pixel includes: a reflecting element on the base substrate, a first electrode on the reflecting element, a light-emitting element on the first electrode, and a second electrode on the light-emitting element; and in each of the pixels, micro-cavity lengths corresponding to the sub-pixels are different, wherein the micro-cavity length is the distance between the side of the reflecting element away from the base substrate and the side of the second electrode proximate to the base substrate.

8 Claims, 6 Drawing Sheets

(51) Int. Cl.
*H01L 51/52* (2006.01)
*H01L 51/56* (2006.01)

(52) U.S. Cl.
CPC ............ *H01L 51/56* (2013.01); *H01L 27/322* (2013.01); *H01L 27/3244* (2013.01); *H01L 2251/558* (2013.01)

(58) Field of Classification Search
USPC .......................................................... 257/89
See application file for complete search history.

(56) References Cited

U.S. PATENT DOCUMENTS

| | | | | |
|---|---|---|---|---|
| 2008/0309232 | A1* | 12/2008 | Yamamoto | .......... H01L 51/5265 |
| | | | | 313/505 |
| 2010/0052524 | A1* | 3/2010 | Kinoshita | ........... H01L 27/3213 |
| | | | | 313/504 |
| 2014/0239272 | A1 | 8/2014 | Kim | |
| 2015/0187858 | A1* | 7/2015 | Wang | ................... H01L 27/3279 |
| | | | | 257/40 |
| 2016/0240820 | A1 | 8/2016 | He et al. | |
| 2018/0226021 | A1* | 8/2018 | Jin | ....................... G09G 3/3208 |
| 2018/0358578 | A1 | 12/2018 | Li et al. | |

FOREIGN PATENT DOCUMENTS

| | | |
|---|---|---|
| CN | 104617225 A | 5/2015 |
| CN | 105489632 A | 4/2016 |
| CN | 106981504 A | 5/2017 |
| CN | 107154424 A | 9/2017 |
| CN | 107204400 A | 9/2017 |

OTHER PUBLICATIONS

Office Action for corresponding Chinese Application No. 201810427174.4 dated Mar. 19, 2021.

* cited by examiner

DISPLAY PANEL WITH VARIABLE MICRO-CAVITY LENGTHS FOR SUB-PIXELS, METHOD FOR FABRICATING THE SAME AND DISPLAY DEVICE

This application is a US National Stage of International Application No. PCT/CN2019/076199, filed Feb. 26, 2019, which claims priority to Chinese Patent Application No. 201810427174.4, filed with the Chinese Patent Office on May 7, 2018, and entitled "Display panel, Method for fabricating the same, and Display device", which is hereby incorporated by reference in its entirety.

FIELD

This disclosure relates to the field of display technologies, and particularly to a display panel, a method for fabricating the same and a display device.

BACKGROUND

At present, micro-displays have been widely applied in the market, and they are particularly applicable to helmet mounted displays, 3D displays, eye-worn displays, etc.; and for example, they can be linked to a mobile communication network, a satellite positioning system, etc., to thereby obtain precise image information at any place and time, and this is of great significance in national defense, aviation, spaceflight, individual battling, and other military applications.

There are various types of micro-displays, and particularly an Organic Light-Emitting Diode (OLED) micro-display enabled by both the micro-electronics and photo-electronics technologies relates to a number of fields of photo-electronics, micro-electronics, electronic information, optics, etc., and is a research field involving the physics, the chemistry, the material science, the electronics, and other studies. The integration of the OLED technologies and the Complementary Metal-Oxide-Semiconductor (CMOS) technologies comes with the integration of the photo-electronics industry and the micro-electronics industry to thereby promote both the development of the next generation of micro-displays, and the research and development of on-silicon organic electronics and even on-silicon molecular electronics. As compared with the Digital Micro-Mirror Displays (DMD) and the Liquid Crystal On-Silicon (LCOS) micro-displays, a user of the OLED micro-display with high brightness, high saturation, low driving voltage, a high response speed, low power consumption, and other excellent display characteristics has a good experience; and an OLED is an all-solid-state element with high robustness to shaking and a wide range of operating temperature (−40° C.~85° C.) is applicable to military and special applications, and since the OLED is a light-emitting element, no backlight source is required, and there are a large range of angles of view, and a small thickness, thus facilitating a smaller volume of the system, so it is particularly applicable to a near-ear display system.

When the OLED micro-display is applied to the Augmented Reality (AR) display technologies, the very core product index required of its display screen is brightness because the brightness of a screen of an AR product shall be adjusted in different operating environments and scenarios to provide a conformable visual experience of human eyes, and the brightness of OLEDs shall be improved particularly in such an outdoor mode that the sun light are incident on the screen. When the OLEDs are applied to a micro-display, a high PPI is unavailable due to a limiting FMM, so all the existing all-color technologies involve white light and a color filter layer. However the advantage of the OLEDs with a high color gamut may be discouraged by the all-color combination of white light and a color filter layer, and since a color gamut of the combination of white light and a color filter layer is approximately 80%, and a color gamut of the real RGB combination is higher than 100%, it is highly desirable to improve the brightness and the color gamut of the OLED display.

SUMMARY

Embodiments of this disclosure provide a display panel, a method for fabricating the same, and a display device so as to address the problem of low brightness and a low color gamut of the OLED display in the prior art.

In a first aspect, an embodiment of this disclosure provides a display panel including: a base substrate, and a plurality of pixels in an array on the base substrate, wherein:
at least one of the pixels includes a plurality of sub-pixels;
at least one of the sub-pixels includes: a reflecting element on the base substrate, a first electrode on the reflecting element, a light-emitting element on the first electrode, and a second electrode on the light-emitting element; and
in at least one of the pixels, micro-cavity lengths corresponding to the plurality of sub-pixels are different, wherein a micro-cavity length is a distance between a side of the reflecting element away from the base substrate and a side of the second electrode proximate to the base substrate.

In a possible implementation, in the display panel above according to the embodiment of this disclosure, the display panel further includes an insulation layer between reflecting surfaces of the reflecting elements and lower surfaces of the first electrodes; and
in at least one of the pixels, thicknesses of the insulation layer corresponding to the plurality of sub-pixels are different.

In a possible implementation, in the display panel above according to the embodiment of this disclosure, at least one of the sub-pixels further includes a connection structure running through the insulation layer, and the connection structure is electrically connected with the first electrode and the reflecting element.

In a possible implementation, in the display panel above according to the embodiment of this disclosure, at least one of the sub-pixels further includes a color filter layer on a side of the second electrode away from the base substrate.

In a possible implementation, in the display panel above according to the embodiment of this disclosure, the micro-cavity length in at least one pixel increases as a wavelength of light emitted from a corresponding sub-pixel increases.

In a possible implementation, in the display panel above according to the embodiment of this disclosure, light emitted from the light-emitting element of at least one of the sub-pixels in at least one pixel is white light.

In a possible implementation, in the display panel above according to the embodiment of this disclosure, the light-emitting element of at least one of the sub-pixels has a same structure, and the light-emitting element includes a red light-emitting layer, a green light-emitting layer, and a blue light-emitting layer.

In a possible implementation, in the display panel above according to the embodiment of this disclosure, the light-emitting element further include a charge generation layer; and the green light-emitting layer is on a side of the red light-emitting layer away from the base substrate, the blue light-emitting layer is on a side of the green light-emitting layer away from the base substrate, and the charge generation layer is between the green light-emitting layer and the blue light-emitting layer.

In a possible implementation, in the display panel above according to the embodiment of this disclosure, the display panel further includes filling structures in gaps between adjacent sub-pixels; and the filling structures are on a side of the first electrodes facing the base substrate.

In a second aspect, an embodiment of this disclosure provides a method for fabricating the display panel above, the method including:

forming a pattern of a reflecting layer on the base substrate to form the reflecting elements of the sub-pixels;

forming the first electrodes of the sub-pixels on the reflecting layer;

forming the light-emitting elements of the sub-pixels on the first electrodes; and forming the second electrodes of the sub-pixels on the light-emitting elements, wherein in at least one of the pixels, micro-cavity lengths corresponding to the plurality of sub-pixels are different, and the micro-cavity length is the distance between the side of the reflecting layer away from the base substrate and the side of the second electrode proximate to the base substrate.

In a possible implementation, in the method above according to the embodiment of this disclosure, at least one pixel includes N sub-pixels, all sub-pixels on the display panel are grouped into N sub-pixel groups, at least one sub-pixel group includes one of sub-pixels in at least one pixel, and the micro-cavity lengths of the sub-pixels in at least one sub-pixel group are same; and forming the first electrodes of the sub-pixels on the reflecting layer includes: forming the first electrodes of the sub-pixels in at least one of the sub-pixel groups respectively, wherein:

for a first sub-pixel group, forming the first electrodes of the sub-pixels in the sub-pixel group includes:

forming a first insulation layer on the reflecting layer, and forming a pattern of a first transparent layer on the first insulation layer to form the first electrodes of the sub-pixels;

for a second to N-th sub-pixel group, forming the first electrodes of the sub-pixels in the sub-pixel group includes:

forming a second insulation layer on the formed first electrodes, and forming a pattern of a second transparent conductive layer on the second insulation layer to form the first electrodes of the sub-pixels; and patterning the second insulation layer to expose all the formed first electrodes.

In a possible implementation, in the method above according to the embodiment of this disclosure, after the first electrodes of the sub-pixels are formed on the reflecting layer, and before the light-emitting elements of the sub-pixels are formed on the first electrodes, the method further includes:

forming a third insulation layer on the first electrodes, and patterning the third insulation layer to form pixel definition structures between adjacent sub-pixels.

In a possible implementation, in the method above according to the embodiment of this disclosure, after the first insulation layer is formed on the reflecting layer, and before the pattern of the first transparent conductive layer is formed on the first insulation layer, the method further includes:

patterning the first insulation layer to form first via-holes running through the first insulation layer;

forming a third conductive layer on the first insulation layer; and performing chemical-mechanical polishing on the third conductive layer to form first connection structures filled in the first via-holes to electrically connect the reflecting elements with the pattern of the first transparent conductive layer.

In a possible implementation, in the method above according to the embodiment of this disclosure, after the second insulation layer is formed, and before the pattern of the second transparent conductive layer is formed on the second insulation layer, the method further includes:

patterning the first insulation layer and all the second insulation layers to form second via-holes running through the first insulation layer and all the second insulation layers;

forming a fourth conductive layer on a farthest second insulation layer to the base substrate; and performing chemical-mechanical polishing on the fourth conductive layer to form second connection structures filled in the second via-holes to electrically connect the reflecting elements with the pattern of the second transparent conductive layer.

In a possible implementation, in the method above according to the embodiment of this disclosure, after the first insulation layer is formed on the reflecting layer, and before the pattern of the first transparent conductive layer is formed on the first insulation layer, the method further includes:

patterning the first insulation layer so that a pattern of the first insulation layer is the same as a pattern of the reflecting layer;

forming a dense layer on the first insulation layer in a high-density plasma process; and performing chemical-physical polishing on the dense layer to form filling structures in gaps between the adjacent sub-pixels.

In a third aspect, an embodiment of this disclosure provides a display device including the display panel above.

Advantageous effects of this disclosure are as follows.

The embodiments of the disclosure provide the display panel, the method for fabricating the same, and the display device. The display panel includes: a base substrate, and a plurality of pixels in an array on the base substrate, wherein at least one pixel includes a plurality of sub-pixels; at least one sub-pixel includes: a reflecting element on the base substrate, a first electrode on the reflecting element, a light-emitting element on the first electrode, and a second electrode on the light-emitting element; and in at least one pixel, micro-cavity lengths corresponding to the plurality of sub-pixels are different, wherein the micro-cavity length is the distance between the side of the reflecting element away from the base substrate and the side of the second electrode proximate to the base substrate. In the display panel according to the embodiment of this disclosure, the reflecting elements are arranged between the first electrodes in the sub-pixels and the base substrate so that the micro-cavity structures are defined between the reflecting elements and the second electrodes, and there are different micro-cavity lengths corresponding to the sub-pixels in at least one sub-pixel, so that light of the single sub-pixel can be modulated. Thus the micro-cavity lengths of the plurality of sub-pixels can be adjusted respectively to thereby improve the purities of light emitted from the sub-pixels so as to improve a color gamut and brightness of the display panel. Accordingly a micro-display in a high-brightness mode can be provided to thereby satisfy a demand for a high color gamut and a high PPI.

DETAILED DESCRIPTION

Figure 1:
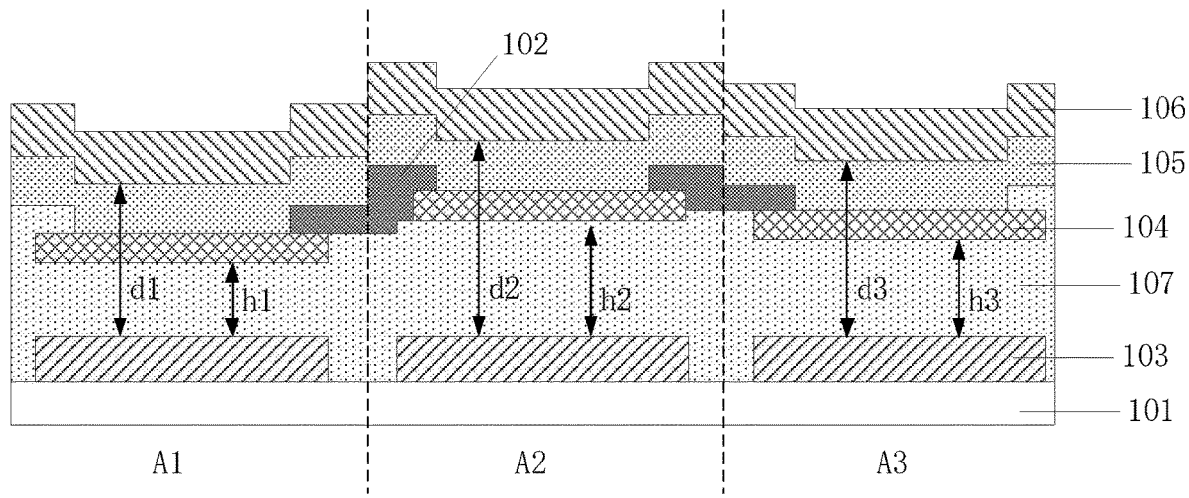
FIG. 1 is a schematic structural diagram of a display panel according to an embodiment of this disclosure.

In view of the problems of low brightness and a low color gamut of an OLED display in the prior art, the embodiments of this disclosure provide a display panel, a method for fabricating the same, and a display device.

Implementations of the display panel, the method for fabricating the same, and the display device according to the embodiments of this disclosure will be described below in details with reference to the drawings. The thicknesses and the shapes of respective layers in the drawings are not intended to reflect any real proportion, but only intended to illustrate this disclosure.

Figure 2:
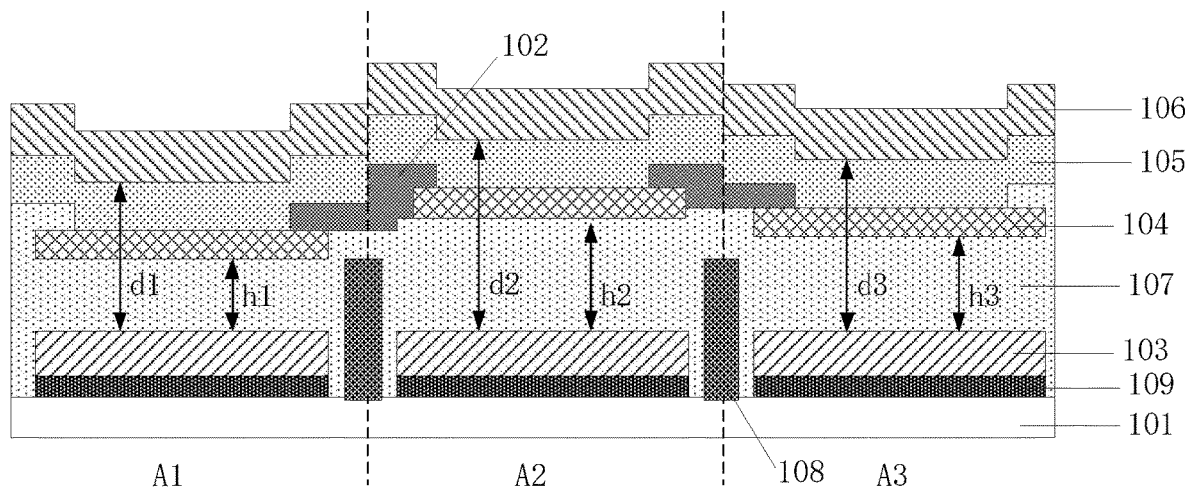
FIG. 2 is a schematic structural diagram of a display panel according to another embodiment of this disclosure.

In a first aspect, an embodiment of this disclosure provides a display panel. As illustrated in FIG. 1 and FIG. 2, the display panel includes: a base substrate 101, and a plurality of pixels in an array on the base substrate 101, where each pixel includes a plurality of sub-pixels (i.e., A1, A2, and A3 as illustrated).

Each sub-pixel includes: a reflecting element 103 on the base substrate 101, a first electrode 104 on the reflecting element 103, a light-emitting element 105 on the first electrode 104, and a second electrode 106 on the light-emitting element 105.

In each pixel, the micro-cavity lengths corresponding to various sub-pixels are different, where the micro-cavity length is the distance between the side of the reflecting element 103 away from the base substrate 101 and the side of the second electrode 106 proximate to the base substrate (i.e., the distances denoted with d1, d2, and d3 as illustrated).

In the display panel according to the embodiment of this disclosure, the reflecting element is arranged between the first electrode in each sub-pixel and the base substrate so that a micro-cavity structure is defined between the reflecting element and the second electrode, and there are different micro-cavity lengths corresponding to plurality of sub-pixels in each pixel. In this way, light of the single sub-pixel can be modulated so that each sub-pixel has its corresponding micro-cavity light journey in OLED element, so the micro-cavity length of each sub-pixel can be adjusted respectively to thereby improve the purity of light emitted from each sub-pixel, so as to improve a color gamut and brightness of the display panel. An effect of high brightness and a high color gamut can be achieved without using any fine metal mask.

As illustrated in FIG. 1 and FIG. 2, in the embodiment of this disclosure, each pixel includes three sub-pixels, for example, and FIG. 1 illustrates a pixel in the display panel. The pixel includes three sub-pixels A1, A2, and A3, and each pixel can alternatively include another number of sub-pixels in a real application, and the number of sub-pixels in each pixel will not be limited here. In a real application, adjacent sub-pixels are spaced by a pixel definition structure 102 as illustrated in FIG. 1.

In the embodiment of this disclosure, the display panel can be an OLED display panel, the first electrode is an anode, and can be made of Indium Tin Oxide (ITO) or another transparent conductive material, and the second electrode can be a cathode made of a semi-transmitting and semi-reflecting metal material; or alternatively the first electrode can be a cathode, and the second electrode can be an anode, although the embodiment of this disclosure will not be limited thereto. The reflecting element can be made of a metal material, e.g., metal aluminum (Al).

The micro-cavity refers to an optical length of two reflecting mirrors, so the micro-cavity structures can be defined between the reflecting elements and the cathodes so that the display panel can be formed with the elements with a strong micro-cavity effect. There is such a strong reflecting effect of the reflecting elements that light beams emitted directly by the light-emitting elements may interfere with light beams reflected by a metal interface so that the elements with the strong micro-cavity effect can narrow a light-emission spectrum of electro-luminescence to thereby improve the purities of respective colors so as to improve the color gamut of the display panel. Since the interference occurs but also the intensity of electro-luminescence is improved, the brightness of the display panel can be improved. Since there are different micro-cavity lengths corresponding to respective sub-pixels in each pixel, e.g., the different micro-cavity lengths d1, d2, and d3 corresponding to the sub-pixels A1, A2, and A3 in FIG. 1, the micro-cavity lengths of the sub-pixels can be adjusted respectively to thereby improve the purities of light exiting the sub-pixels in a real application.

In the embodiment of this disclosure, light-emitting elements in sub-pixels in each pixel have the same structure, and white light can emit from the pixel. Specifically the light-emitting element in each sub-pixel optionally includes a stacked structure of a red light-emitting layer, a green light-emitting layer, and a blue light-emitting layer, and the micro-cavity length of each sub-pixel can be adjusted so that different color light is emitted by the light-emitting elements in different sub-pixels. For example, blue light can be emitted from the light-emitting element in the sub-pixel A1, red light can be emitted from the light-emitting element in the sub-pixel A2, and green light can be emitted from the light-emitting element in the sub-pixel A3, so that only red light can be transmitted through a red color filter layer, only green light can be transmitted through a green color filter layer, and only blue light can be transmitted through a blue color filter layer.

Moreover the display panel according to the embodiment of this disclosure can be applied to an OLED micro-display, and for example, can be arranged in a micro-display of a helmet or another near-eye device, and the base substrate optionally can a wafer. In a real application, all the drivers of the display panel, including a pixel driver, a Gate Driver On Array (GOA), an Integrated Circuit (IC) driver, etc., can be integrated on the wafer, and thereafter the anodes, the light-emitting layers, the cathodes, the color filter layers, and other structures can be formed. However it may be difficult to form an element with a PPI of more than 800 due to a limiting Fine Metal Mask (FMM) in a fabrication process, and the PPI of the helmet mounted micro-display is required to be more than 2000, so a white-light OLED element with a high PPI cannot be formed by evaporating a light-emitting layer using an FMM. In the embodiment of this disclosure, there are different micro-cavity lengths of respective sub-pixels in each pixel to thereby modulate light of the respective sub-pixels so that the color gamut and the brightness of the white-light OLED elements can be improved without using any FMM.

Specifically in the display panel according to the embodiment of this disclosure, as illustrated in FIG. 1 and FIG. 2, the display panel can further include a insulation layer 107 located between reflecting surfaces of the reflecting elements 103, and lower surfaces of the first electrodes 104.

The thicknesses of the insulation layer 107 corresponding to the plurality of sub-pixels in each pixel are different.

As illustrated in FIG. 1 and FIG. 2, the thickness of the insulation layer corresponding to the sub-pixel A1 is h1, the thickness of the insulation layer corresponding to the sub-pixel A2 is h2, and the thickness of the insulation layer corresponding to the sub-pixel A3 is h3; and thicknesses of the insulation layer corresponding to the plurality of sub-pixels are arranged to be different so that the micro-cavity lengths corresponding to the sub-pixels are different, and thus the micro-cavity lengths of the respective sub-pixels can be adjusted without changing the structure of the first electrodes, the second electrodes and light-emitting layer. The thickness of the insulation layer corresponding to each sub-pixel can be determined as needed in reality; and for example, h1 can be 500 Å, h2 can be 2500 Å, and h3 can be 1500 Å, although the embodiment of this disclosure will not be limited thereto.

Specifically in the display panel above according to the embodiment of this disclosure, each sub-pixel can further include a connection structure running through the insulation layer 107, e.g., a first connection structure 505 and a second connection structure 506 as illustrated in FIG. 6e to FIG. 6k, where two ends of each connection structure are electrically connected with the first electrode 103 and the reflecting element 104 so that a signal can be applied to the first electrode through the reflecting element to thereby subsequently drive the first electrode 104 of each sub-pixel.

In a specific implementation, in the display panel above according to the embodiment of this disclosure, the sub-pixel can further include a color filter layer located on the side of the second electrode away from the base substrate. In the embodiment of this disclosure, each pixel includes a plurality of sub-pixels, and the color filter layers are arranged on the sides of the second electrodes away from the base substrate so that an image can be displayed in color on the display panel, and in each pixel, the color filter layer corresponding to each sub-pixel is in different color. As illustrated in FIG. 1, for example, the sub-pixel A1 can correspond to a blue color filter layer, the sub-pixel A2 can correspond to a red color filter layer, and the sub-pixel A3 can correspond to a green color filter layer.

Furthermore in the display panel above according to the embodiment of this disclosure, the micro-cavity lengths increase with the wavelengths of light emitted from the corresponding sub-pixels in each pixel increase.

A micro-cavity phase difference $\delta = 2 j(\lambda/2) = 2 nd \cos \theta$, where j is an integer, $\lambda$ is a wavelength of the emitted light, n is an average refractive index of a medium in a micro-cavity, d is the micro-cavity length, and $\theta$ is a reflection angle.

As can be apparent from the equation above of the micro-cavity phase difference, the micro-cavity length is in proportion to the wavelength of the emitted light, so the micro-cavity length increases as the wavelength of the light emitted from a corresponding sub-pixel increases. Moreover in a specific implementation, the micro-cavity length can alternatively be set as needed in reality, but will not be limited here to any specific length.

Moreover in order to obtain enhanced interference and optimize the light emitted from an element, then a light-emitting body needs to be located at such a distance from a metal electrode that is approximate to an opposite node of a primary light-emission wavelength, that is, a change in phase of the round-trip light path between the light-emitting body and the metal electrode is an integer multiple of $2\pi$.

Still furthermore in the display panel above according to the embodiment of this disclosure, as illustrated in FIG. 2, the display panel can further include: filling structures 108 located in gaps between adjacent sub-pixels.

The filling structures 108 are located on the sides of the first electrodes 104 facing the base substrate 101.

The filling structures 108 can be arranged in the gaps between the adjacent sub-pixels to thereby improve the effect of fixing the sub-pixels, and prevent the subsequently formed first electrodes from being short-circuited with each other. In a specific implementation, the filling structures 108 optionally can be formed in a High-Density Plasma (HDP) process. Since a dense layer can be formed in the HDP process, the filling structures 108 are formed densely to thereby improve the effect of fixing the sub-pixels.

In a real application, in the display panel above according to the embodiment of this disclosure, white light are emitted from light-emitting elements of the sub-pixels in each pixel.

After the white light emitted from the light-emitting elements of the respective sub-pixels pass the corresponding color filter layers, an image can be displayed in color. Since the respective sub-pixels in each pixel emit the white light, the light-emitting elements of the respective sub-pixels can be arranged in the same structure.

Specifically the light-emitting element can include a red light-emitting layer, a green light-emitting layer, and a blue light-emitting layer so that red light emitted from the red light-emitting layer, green light emitted from the green light-emitting layer, and blue light emitted from the blue light-emitting layer can be mixed into white light.

Figure 3:
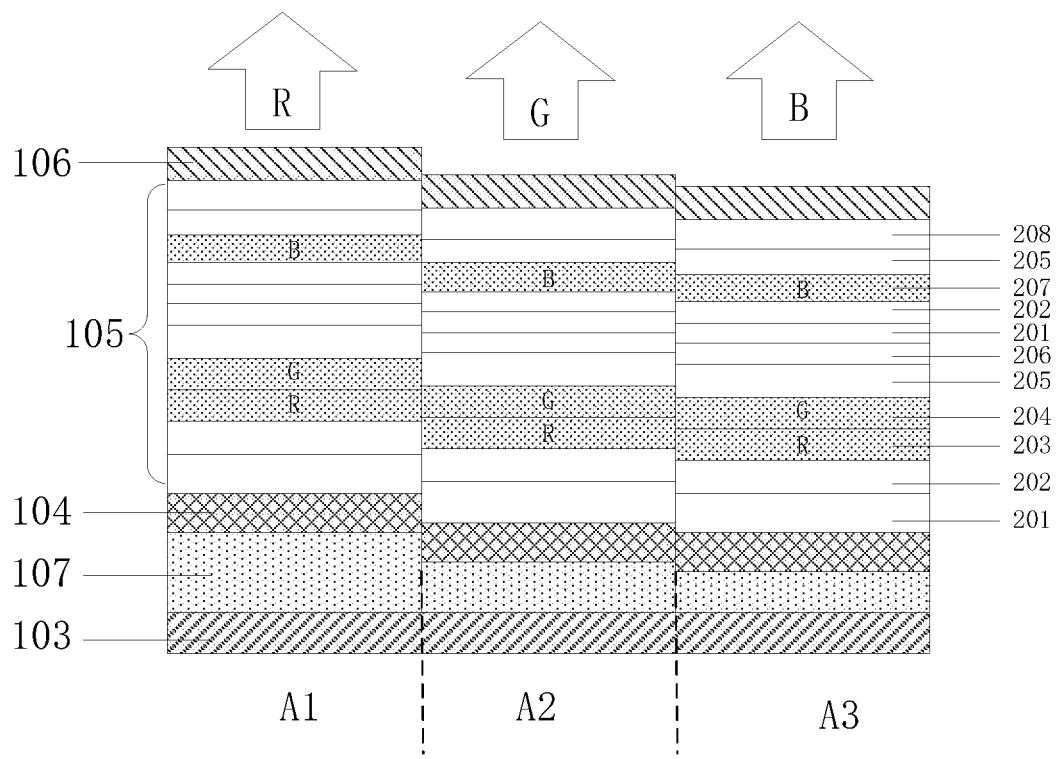
FIG. 3 is a schematic structural diagram of a display panel according to still another embodiment of this disclosure.

Furthermore as illustrated in FIG. 3, the light-emitting element can further include a charge generation layer 206.

The green light-emitting layer 204 is located on the side of the red light-emitting layer 203 away from the base substrate 101, the blue light-emitting layer 207 is located on the side of the green light-emitting layer 204 away from the base substrate 101, and the charge generation layer 206 is located between the green light-emitting layer 204 and the blue light-emitting layer 207.

In a specific implementation, the light-emitting element can be structured in a stack. As illustrated in FIG. 3, the light-emitting element in each sub-pixel can include a Hole Injection Layer (HIL) 201, a Hole Transport Layer (HTL) 202, a red light-emitting layer 203, a green light-emitting layer 204, an Electron Transport Layer (ETL) 205, a Charge Generation Layer (CGL) 206, a Hole Injection Layer 201, a hole transport layer 202, a blue light-emitting layer 207, an electron transport layer 205, and an Electron Injection Layer (EIL) 208 arranged successively in the direction from the first electrode 104 to the second electrode 106. The light-emitting elements of different sub-pixels are in the same structure, and correspond to different thicknesses of the insulation layer, so that there are different micro-cavity lengths between the reflecting elements 103 and the second electrodes 106.

In a second aspect, based upon the same inventive idea, an embodiment of this disclosure provides a method for fabricating the display panel above, and since the method addresses the problem under a similar principle to the display panel above, reference can be made to the implementation of the display panel above for an implementation of the method, and a repeated description thereof will be omitted here.

Figure 4:
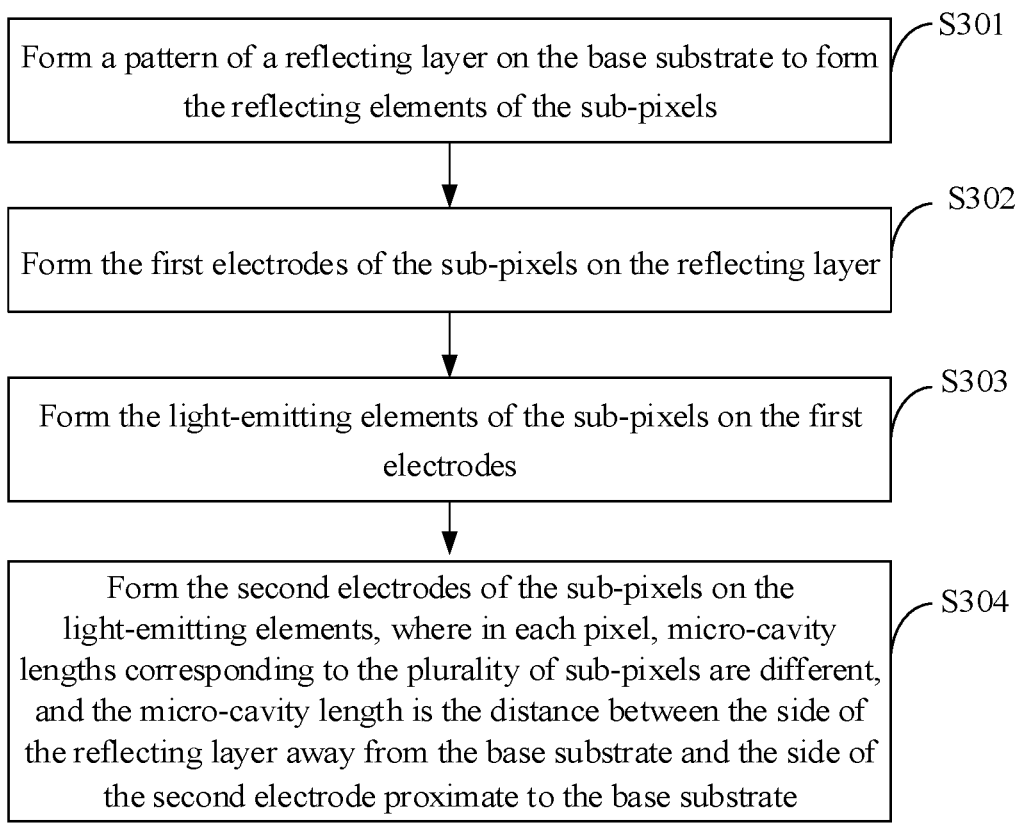
FIG. 4 is a flow chart of a method for fabricating a display panel according to an embodiment of this disclosure.

As illustrated in FIG. 4, the method for fabricating the display panel according to the embodiment of this disclosure includes the following steps.

The step S301 is to form a pattern of a reflecting layer on the base substrate to form the reflecting elements of the sub-pixels.

The step S302 is to form the first electrodes of the sub-pixels on the reflecting layer.

The step S303 is to form the light-emitting elements of the sub-pixels on the first electrodes.

The step S304 is to form the second electrodes of the sub-pixels on the light-emitting elements, where in each pixel, the micro-cavity lengths corresponding to the sub-pixels are different, and the micro-cavity length is the distance between the side of the reflecting layer away from the base substrate, and the side of the second electrode proximate to the base substrate.

In the method for fabricating the display panel according to the embodiment of this disclosure, the reflecting element is arranged between the first electrode in each sub-pixel, and the base substrate so that a micro-cavity structure is defined between the pixel element and the second electrode, and there are different micro-cavity lengths corresponding to sub-pixels in each pixel. In this way, light of the single sub-pixel can be modulated so that the micro-cavity lengths of the sub-pixels can be adjusted respectively to thereby improve the purities of light emitted from the respective sub-pixels so as to improve a color gamut and brightness of the display panel.

In the step S301 above, the base substrate can be a wafer, and the reflecting layer is generally made of a metal material, e.g., aluminum, and can have a thickness of approximately 1000 Å. As illustrated in FIG. 2, in order to improve the effect of contacting the reflecting elements with the base substrate, and their adhesion thereto, a contact layer 109 can be further formed before the reflecting layer is formed, where the contact layer can be made of titanium (Ti), and have a thickness of approximately 250 Å. Since there is the same pattern of the reflecting layer and the contact layer, the reflecting layer and the contact layer can be patterned in the same etching process using the same mask in a real fabrication process. Specifically after the reflecting layer and the contact layer are formed on the base substrate, a photo-resist layer is coated on the reflecting layer, and patterned through exposure and development so that those components which are not to be etched are shielded by the photo-resist, and thereafter the reflecting layer is etched. Moreover there may also be the same pattern of a first insulation layer to be formed in the subsequent step 401, and the reflecting layer so that the contact layer, the reflecting layer, and the first insulation layer can be further etched together after the first insulation layer is formed, that is, photo-resist is further coated thereon, exposed, developed, and etched after the first insulation layer is formed.

Furthermore in the method above according to the embodiment of this disclosure, each pixel includes N sub-pixels, all the sub-pixels on the display panel are grouped into N sub-pixel groups, each sub-pixel group includes one of sub-pixels in each pixel, and the micro-cavity lengths of the sub-pixels in each sub-pixel group are same.

Figure 5:
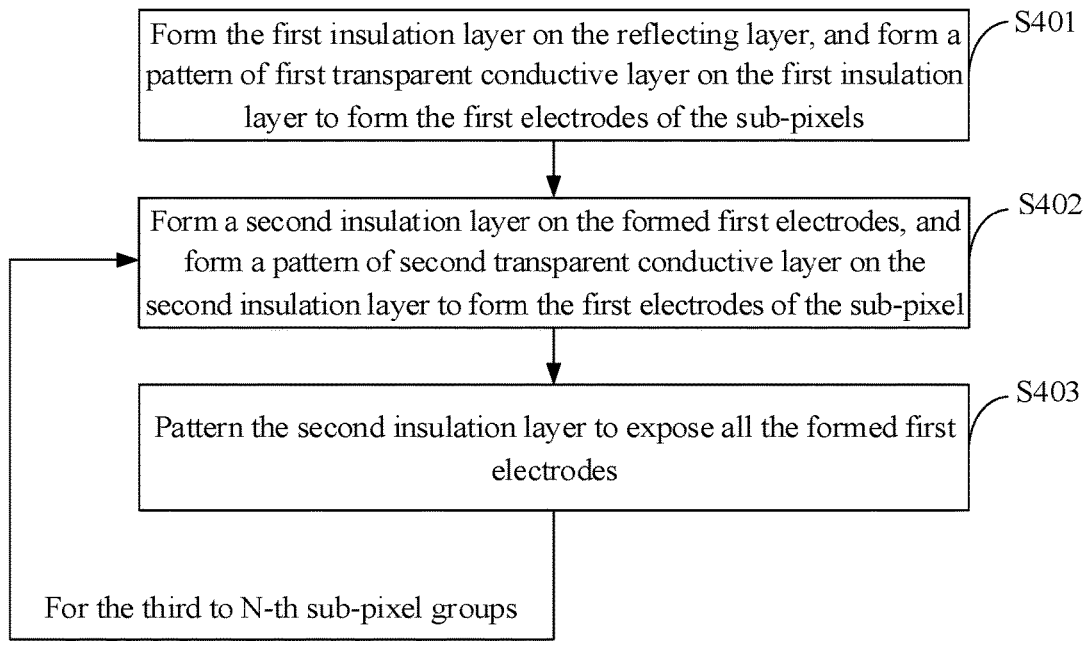
FIG. 5 is a flow chart of a method for fabricating a display panel according to another embodiment of this disclosure.

As illustrated in FIG. 5, the step S302 of forming the first electrodes of the sub-pixels on the reflecting layer can include the step of forming the first electrodes of the sub-pixels in the sub-pixel groups successively. For the first sub-pixel group, the first electrodes of the sub-pixels in the sub-pixel group are formed in the following step.

The step S401 is to form the first insulation layer on the reflecting layer, and to form a pattern of first transparent conductive layers on the first insulation layer to form the first electrodes of the sub-pixels.

For the second to N-th sub-pixel groups, the first electrodes of the sub-pixels in each of the sub-pixel groups are formed in the following step.

The step S402 is form a second insulation layer on the formed first electrodes, and to form a pattern of second transparent conductive layer on the second insulation layer to form the first electrodes of the sub-pixels.

The step S403 is to pattern the second insulation layer to expose all formed first electrodes.

In the embodiment of this disclosure, micro-cavity lengths of the sub-pixels in each pixel are different, and sub-pixels with the same micro-cavity length on the display panel are a sub-pixel group, that is, sub-pixels emitting light in the same color are a sub-pixel group, so the number of sub-pixel groups is the same as the number of sub-pixels in each pixel. For example, each pixel includes three sub-pixels A1, A2, and A3, so all sub-pixels on the display panel can be grouped into three groups including the first sub-pixel group includes all sub-pixels A1, the second sub-pixel group includes all sub-pixels A2, and the third sub-pixel group includes all sub-pixels A3.

In the step S401, there are no first electrodes on the base substrate while the first electrodes in the first sub-pixel group are being formed, so there is no step of etching the first insulation layer to expose the previously formed first electrodes after the step S401. There are some first electrodes on the base substrate before the step S402, so the second insulation layer shall be patterned after the step S402, to thereby expose the previously formed first electrodes.

Before the first electrodes in the second to N-th sub-pixel groups are formed, there is substantially the same structure on the base substrate including some first electrodes, so the first electrodes in the second to N-th sub-pixel groups are formed in the same steps, that is, the step S402 and the step S403 are applicable to each of the second to N-th sub-pixel groups.

The steps above will be described below in details by way of an example in which each pixel includes three sub-pixels A1, A2, and A3, but the description will apply when each sub-pixel includes more sub-pixels, and a repeated description thereof will be omitted here.

All sub-pixels on the display panel are grouped into three groups so that the first sub-pixel group includes all sub-pixels A1, the second sub-pixel group includes all sub-pixels A2, and the third sub-pixel group includes all sub-pixels A3. The first electrodes will be formed below in the order of the first sub-pixel group, the second sub-pixel group, and the third sub-pixel group, for example. In a specific implementation, the first electrodes in the sub-pixel groups optionally can be formed in an ascending order of their micro-cavity lengths, although the embodiment of this disclosure will not be limited thereto.

Figure 6A:
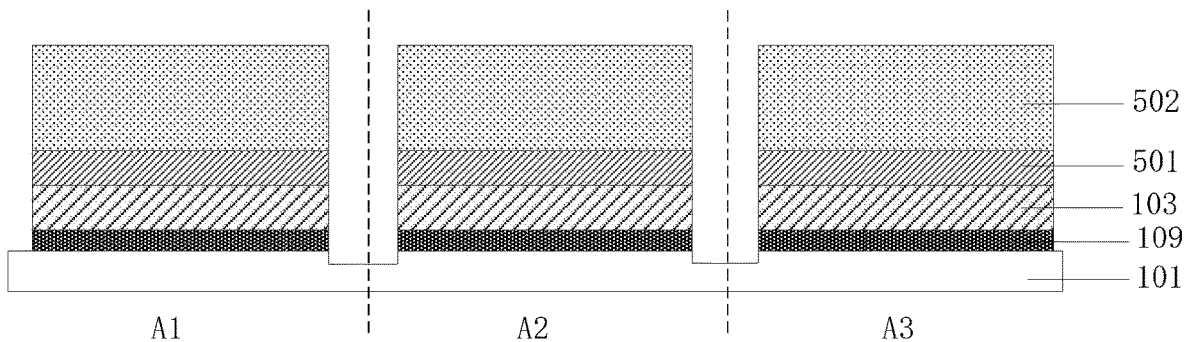
FIG. 6a to FIG. 6k are schematic structural diagrams in a process of the method as illustrated in FIG. 4 and FIG. 5 according to the embodiments of this disclosure.
Figure 6B:
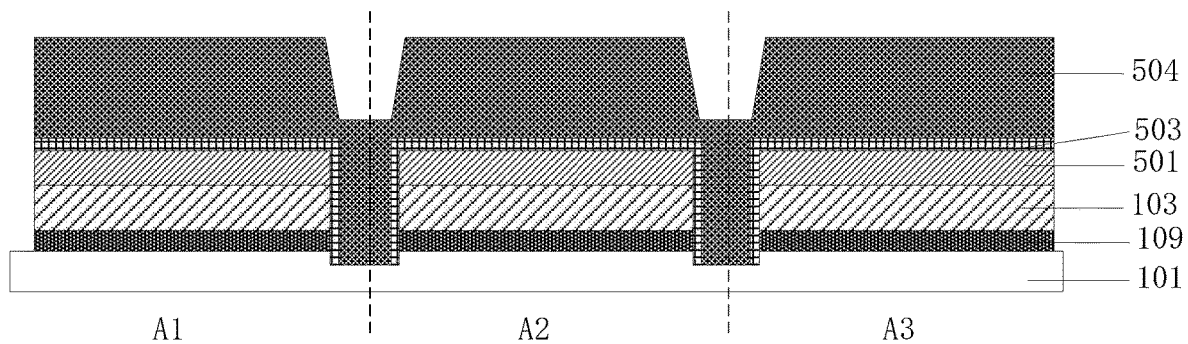
Figure 6C:
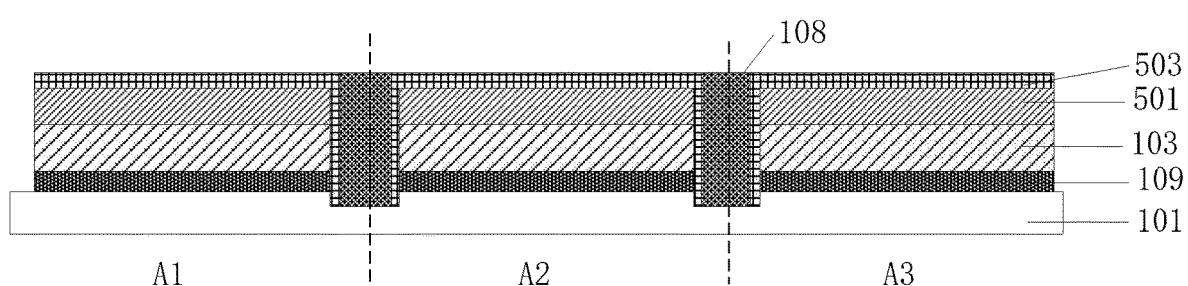
Figure 6D:
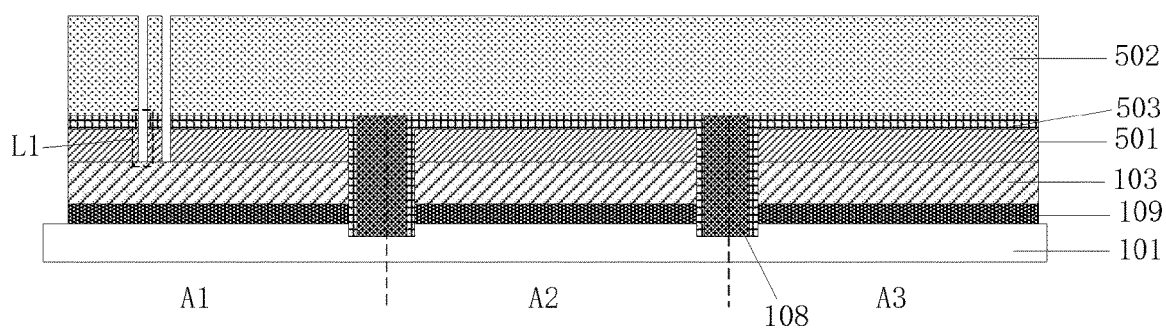
Figure 6E:
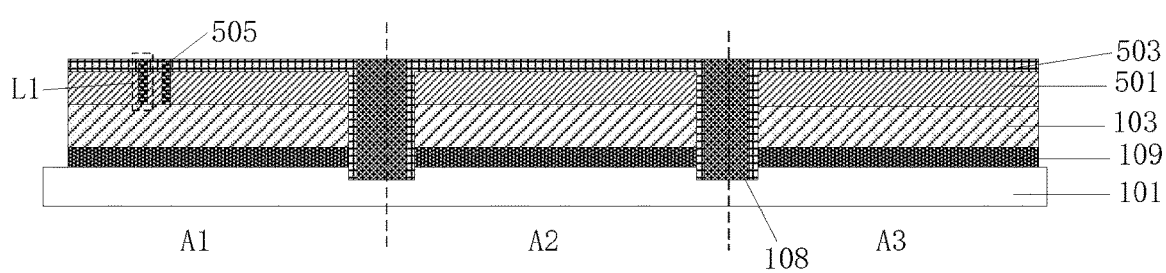
Figure 6F:
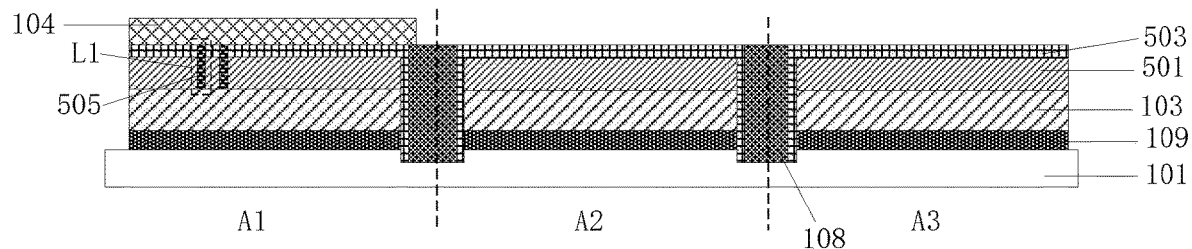

For the first sub-pixel group as illustrated in FIG. 6f, a the first insulation layer 501 is formed on the reflecting layer, and the pattern of the first transparent conductive layer is formed on the first insulation layer 501 to form the first electrodes 104 of the sub-pixels A1, where the first insulation layer can be made of SiO, and have a thickness of approximately 300 Å.

Figure 6G:
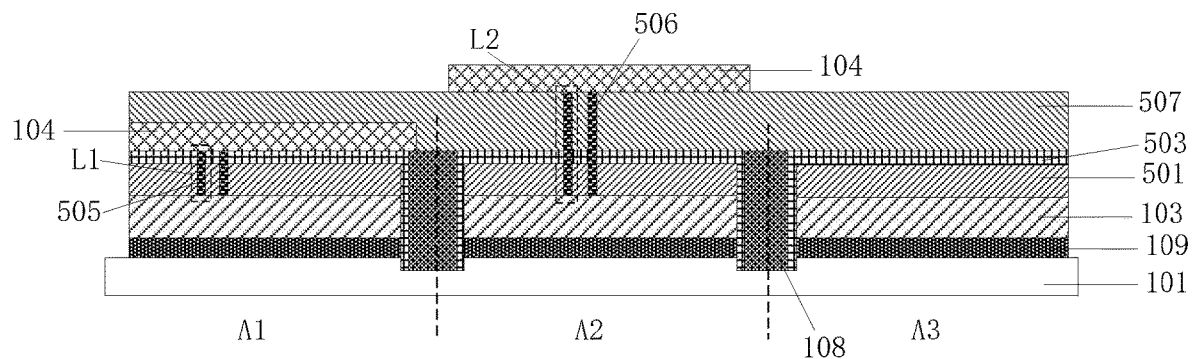
Figure 6H:
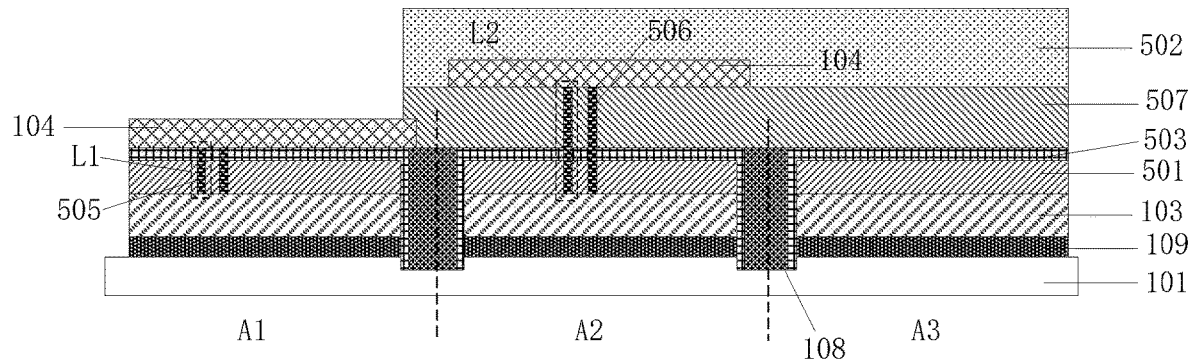

For the second sub-pixel group, as illustrated in FIG. 6g, the second insulation layer 507 is formed on the first electrodes 104 of the sub-pixels A1, and the pattern of the second transparent conductive layer is formed on the second insulation layer 507 to form the first electrodes 104 of the sub-pixels A2. As illustrated in FIG. 6h, the second insulation layer 507 is patterned. Specifically firstly a photo-resist layer 502 is formed above the second insulation layer 507, and exposed, developed, etc., thereafter the second insulation layer 507 is etched to expose the first electrodes 104 of the sub-pixels A1, and then the photo-resist layer 502 is removed through ashing to expose the first electrodes 104 of the sub-pixels A2.

Figure 6I:
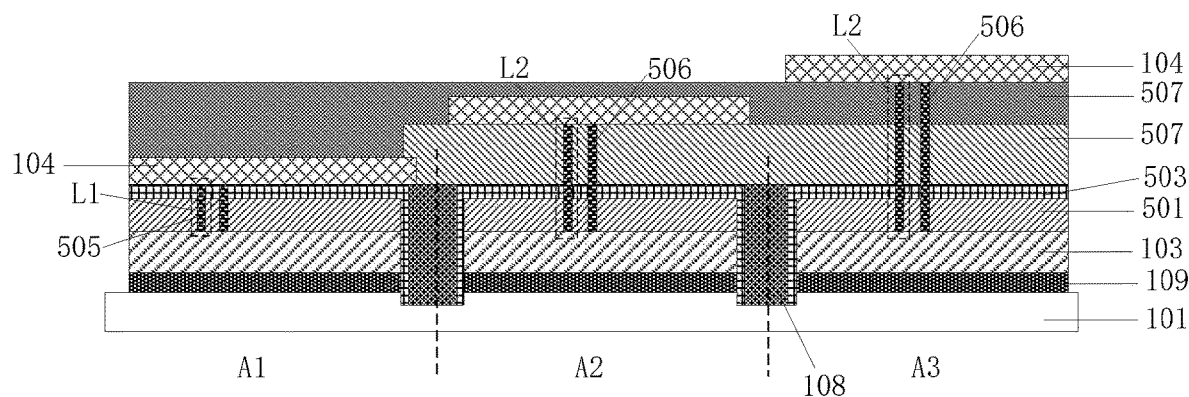
Figure 6J:
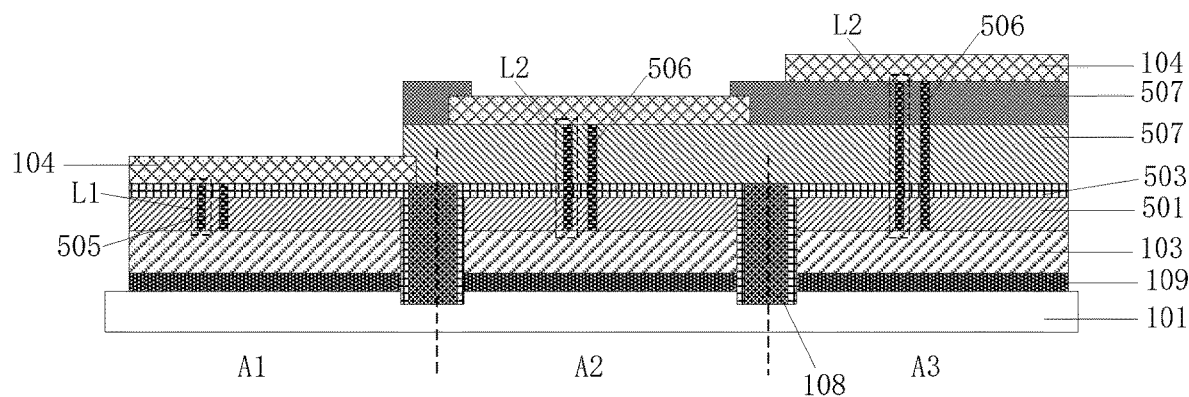

For the third sub-pixel group, as illustrated in FIG. 6i, a second insulation layer 507 is further formed on the formed first electrodes 104 to cover the previously formed first electrodes 104 of the sub-pixels A1 and the sub-pixels A2, and the pattern of the second transparent conductive layer is further formed on the second insulation layer 507 to form the first electrodes 104 of the sub-pixels A3. As illustrated in FIG. 6j, the second insulation layer 507 is patterned to expose the previously formed first electrodes 104 of the sub-pixels A1 and the sub-pixels A2. The steps thereof can be the same as the corresponding steps for the second sub-pixel group.

Furthermore in the method above according to the embodiment of this disclosure, after the step S302, and before the step S303, the method can further include the step of forming the pixel definition structures, where this step specifically includes: forming a third insulation layer on the first electrodes, and patterning the third insulation layer to form the pixel definition structures between the adjacent sub-pixels.

Figure 6K:
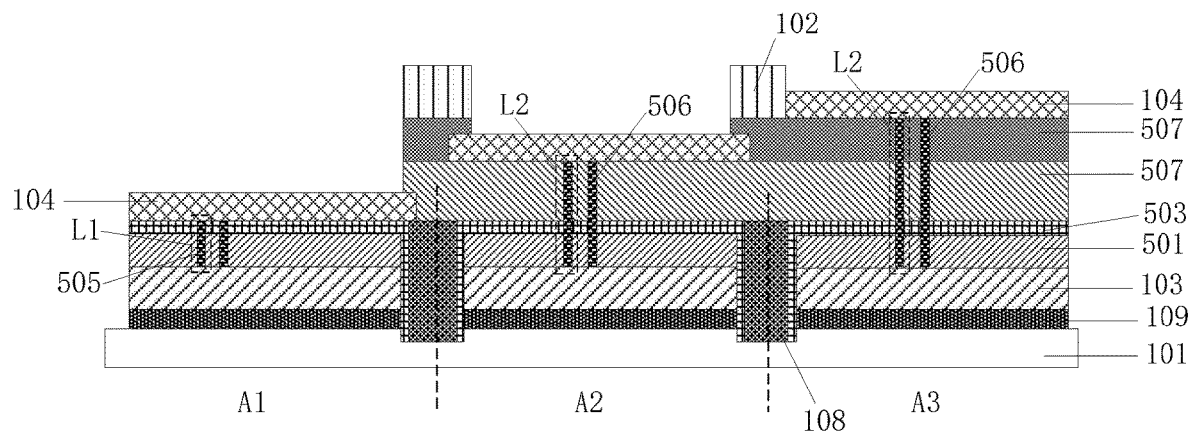

Take each pixel including three sub-pixels A1, A2, and A3 as an example, as illustrated in FIG. 6k, after all first electrodes 104 on the display panel are formed, the third insulation layer (where the pixel definition structures 102 are located as illustrated) are formed on the first electrodes 104, and patterned to form the pixel definition structures 102 between the adjacent sub-pixels, where the pixel definition structures 102 are represented as squares. In a specific implementation, the shape of the pixel definition structures can be set as needed in reality, and they are illustrated here only for the sake of convenience, but their shape will not be limited thereto. The height of the pixel definition structure can be set less than 650 Å, and optionally can be 200 Å. The material of the pixel definition structure can be silicon nitride, silicon oxide, or another material.

Specifically in the method above according to the embodiment of this disclosure, in the step S401, after the first insulation layer is formed on the reflecting layer, and before the pattern of the first transparent conductive layer is formed on the first insulation layer, the method can further include the step of forming first via-holes L1 and first connection structures 505 as illustrated in FIG. 6d and FIG. 6e, where this step is performed as follows.

As illustrated in FIG. 6d, the first insulation layer 501 is patterned to form the first via-holes L1 running through the first insulation layer 501. As an example, a specific process thereof is as follows: a first photo-resist layer 502 is coated on the first insulation layer 501, and exposed, developed, etc., to shield those areas which are not to be etched, and to expose those areas to be etched, so that the first via-holes L1 can be formed through etching, where two first via-holes L1 are illustrated, for example, but the number of first via-holes L1 will not be limited thereto.

The third conductive layer is formed on the first insulation layer 501, where the material of the third conductive layer optionally can be tungsten, or can be another conductive material, although the embodiment of this disclosure will not be limited thereto.

Chemical-Mechanical Polishing (CMP) is performed on the third conductive layer to form the first connection structures 505 filled in the first via-holes L1 as illustrated in FIG. 6e.

In the embodiment of this disclosure, the first via-holes L1 are formed in the first insulation layer, and the conductive material is filled in the first via-holes L1 so that the first electrodes of the first sub-pixel group to be formed (the pattern of the first transparent conductive layer) can be electrically connected with the reflecting elements, and subsequently a driving signal can be applied to the first electrodes.

Alike in the method above according to the embodiment of this disclosure, in the step S402, after the second insulation layer is formed, and before the pattern of the second transparent conductive layer is formed on the second insulation layer, the method can further include the step of forming second via-holes L2 and the second connection structures 506, where this step is as follows.

As illustrated in FIG. 6g and FIG. 6i, the first insulation layer 501 and all the second insulation layers 507 are patterned to form the second via-holes L2 running through the first insulation layer 501 and all the second insulation layers 507. As illustrated in FIG. 6g, before the first electrodes 104 in the second sub-pixel group are formed, there are the first insulation layer 501 and the second insulation layer 507 between the first electrode 104 to be formed (the first electrode of the sub-pixel A2 in FIG. 6g and FIG. 6i) and the base substrate 101, so for the structure of the sub-pixel A2, the first insulation layer 501 and the second insulation layer 507 are etched to form the second via-hole L2. As illustrated in FIG. 6i, after the first electrodes 104 in the second sub-pixel group are formed, there are the first insulation layer 501 and two second insulation layers 507 between the first electrode 104 in the third sub-pixel group to be formed (the first electrode of the sub-pixel A3 as illustrated in FIG. 6i) and the base substrate 101, so for the structure of the sub-pixel A3, the first insulation layer 501 and the two second insulation layers 507 are etched to form the second via-holes L2; and as illustrated, each sub-pixel includes two second via-holes L2, for example, but the number of second via-holes L2 will not be limited thereto.

After the step of forming the second via-holes L2, the fourth conductive layer is formed on the farthest second insulation layer 507 to the base substrate 101, where the material of the fourth conductive layer optionally can be tungsten, or can be another conductive material, although the embodiment of this disclosure will not be limited thereto.

Chemical-Mechanical Polishing is performed on the fourth conductive layer to form the second connection structures 506 filled in the second via-holes L2.

In the embodiment of this disclosure, the second via-holes L2 running through the first insulation layer and the second insulation layer are formed, and the conductive material is filled in the second via-holes L2 so that the first electrodes to be formed in the second to N-th sub-pixel groups can be electrically connected with the reflecting elements, and subsequently a driving signal can be applied to the first electrodes.

In a specific implementation, in the method above according to the embodiment of this disclosure, in the step S401, after the first insulation layer is formed on the reflecting layer, and before the pattern of the first transparent conductive layer is formed on the first insulation layer, the method can further include the followings.

The first insulation layer 501 is patterned so that the pattern of the first insulation layer 501 is the same as the pattern of the reflecting layer. As illustrated in FIG. 6a, the pattern of the first insulation layer 501 is the same as the pattern of the reflecting layer, so the reflecting layer, the contact layer, and the first insulation layer are etched using the same mask after the first insulation 501 is formed. Specifically after the first insulation layer 501 is formed, a photo-resist layer 502 is coated on the first insulation layer 501, and exposed, developed, etc., to expose those areas to be etched, and the first insulation 501, the reflecting layer, and the contact layer 109 are patterned in an etching process.

Furthermore after the first insulation layer 501 is patterned, the method can further include the steps of:

Forming a dense layer 504 with a thickness of approximately 5000 Å on the first insulation layer 501 in a High-Density Plasma (HDP) process, as illustrated in FIG. 6b; and Performing Chemical-Physical Polishing (CMP) on the dense layer 504 to form the filling structures in the gaps between the adjacent sub-pixels as illustrated in FIG. 6c.

Since a dense layer is formed in the HDP process, the formed filling structures 108 are dense to thereby improve the effect of fixing the sub-pixels. Since the material of the filling structures is dense, the insulation layer or the transparent conductive material can be prevented from being over-etched while being subsequently etched, to thereby prevent the adjacent first electrodes to be formed, from being short-circuited.

In order to improve a contact effect, before the dense layer 504 is formed, a thin insulation film 503 with a thickness of approximately 600 Å, e.g., a thin film of SiO, can be further formed on the first insulation layer 501 as illustrated in FIG. 6b and FIG. 6c. After the dense layer 504 is formed, the dense layer 504 can be further post-baked so that the dense layer 504 can be subsequently polished. For example, there is a gap with a width of approximately 0.2 µm between adjacent sub-pixels, so the width of a formed filling structure is less than 0.2 µm.

In a third aspect, based upon the same inventive idea, an embodiment of this disclosure provides a display device including the display panel above. The display device can be applicable to a phone, a tablet computer, a TV set, a display, a notebook computer, a digital photo frame, a navigator, or any other product or component with a display function. Since the display device addresses the problem under a similar principle to the display pane above, reference can be made to the implementation of the display panel for an implementation of the display device, so a repeated description thereof will be omitted here.

In the display panel, the method for fabricating the same, and the display device according to the embodiments of this disclosure, the reflecting element is arranged between the first electrode in each sub-pixel and the base substrate, so that a micro-cavity structure is defined between the pixel element and the second electrode, and there are different micro-cavity lengths corresponding to respective sub-pixels in each pixel. In this way, light of the single sub-pixel can be modulated so that each sub-pixel has its corresponding micro-cavity light journey in OLED element, so the micro-cavity lengths of the sub-pixels can be adjusted respectively to thereby improve the purities of light emitted from the sub-pixels so as to improve a color gamut and brightness of the display panel. An effect of high brightness and a high color gamut can be achieved without using any fine metal mask.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A display panel, comprising: a base substrate, and a plurality of pixels in an array on the base substrate, wherein:
   at least one of the pixels comprises a plurality of sub-pixels;
   at least one of the sub-pixels comprises: a reflecting element on the base substrate, a first electrode on the reflecting element, a light-emitting element on the first electrode, a second electrode on the light-emitting element, and a color filter layer on a side of the second electrode away from the base substrate; and
   in at least one of the pixels, micro-cavity lengths corresponding to the plurality of sub-pixels are different, light emitted from the light-emitting element of each of the plurality of sub-pixels is white light, the light-emitting element of each of the plurality of sub-pixels comprises a red light-emitting layer, a green light-emitting layer, a blue light-emitting layer, and a charge generation layer, wherein a micro-cavity length is a distance between a side of the reflecting element away from the base substrate and a side of the second electrode proximate to the base substrate, the green light-emitting layer is on a side of the red light-emitting layer away from the base substrate, the blue light-emitting layer is on a side of the green light-emitting layer away from the base substrate, and the charge generation layer is between the green light-emitting layer and the blue light-emitting layer.

2. The display panel according to claim 1, further comprising an insulation layer between reflecting surfaces of the reflecting elements and lower surfaces of the first electrodes; and
   in at least one of the pixels, thicknesses of the insulating layer corresponding to the plurality of sub-pixels are different.

3. The display panel according to claim 2, wherein at least one of the sub-pixels further comprises a connection structure running through the insulation layer, and the connection structure is electrically connected with the first electrode and the reflecting element.

4. The display panel according to claim 1, wherein the micro-cavity length in at least one pixel increases as a wavelength of light emitted from a corresponding sub-pixel increases.

5. The display panel according to claim 1, further comprising filling structures in gaps between adjacent sub-pixels; and
the filling structures are on a side of the first electrodes facing the base substrate.

6. A display device, comprising the display panel according to claim 1.

7. The display panel according to claim 5, wherein the filling structures are formed in a High-Density Plasma process.

8. The display panel according to claim 5, wherein a width of the filling structure in an arrangement direction of the sub-pixels is less than 0.2 μm.

* * * * *